United States Patent [19]
Bown et al.

[11] 3,943,539
[45] Mar. 9, 1976

[54] VERTICAL PLATE PROCESSOR

[75] Inventors: Delos Edward Bown, White Plains, N.Y.; James Marriott Graves, Stamford, Conn.

[73] Assignee: Polychrome Corporation, Yonkers, N.Y.

[22] Filed: Oct. 2, 1974

[21] Appl. No.: 511,147

[52] U.S. Cl. .............................................. 354/302
[51] Int. Cl.² ........................................... G03D 3/00
[58] Field of Search ...................... 354/93, 297, 302

[56] References Cited
UNITED STATES PATENTS
2,380,378  7/1945  Allen .................................... 354/93
3,261,277  7/1966  Limberger ......................... 354/302

Primary Examiner—John M. Horan

[57] ABSTRACT

A compact vertical plate processor providing dwell time, brushing and squeegee for developing plates which are inserted vertically from the top of the processor between pairs of transport rollers and brush rollers and thereby immersed in a developing solution. A spring-loaded cam lever mechanism separates each pair of upper and lower transport rollers as well as an intermediate pair of brush rollers from a contacting position to a loading position to permit insertion of a plate into the solution. After a pre-set dwelling time, a drive motor is activated for rotating the rollers to deliver the plate up out of the processor. Also, an adjustable plate size adapter sets the height at which the plate can be lowered into the tank so that such plate never falls from between the nip of the lowest set of rollers in the processor. The processor provides automatic developing of the plate in a vertical, non-feedthrough operation, thereby permitting a compact apparatus requiring a minimum of table top space.

21 Claims, 9 Drawing Figures

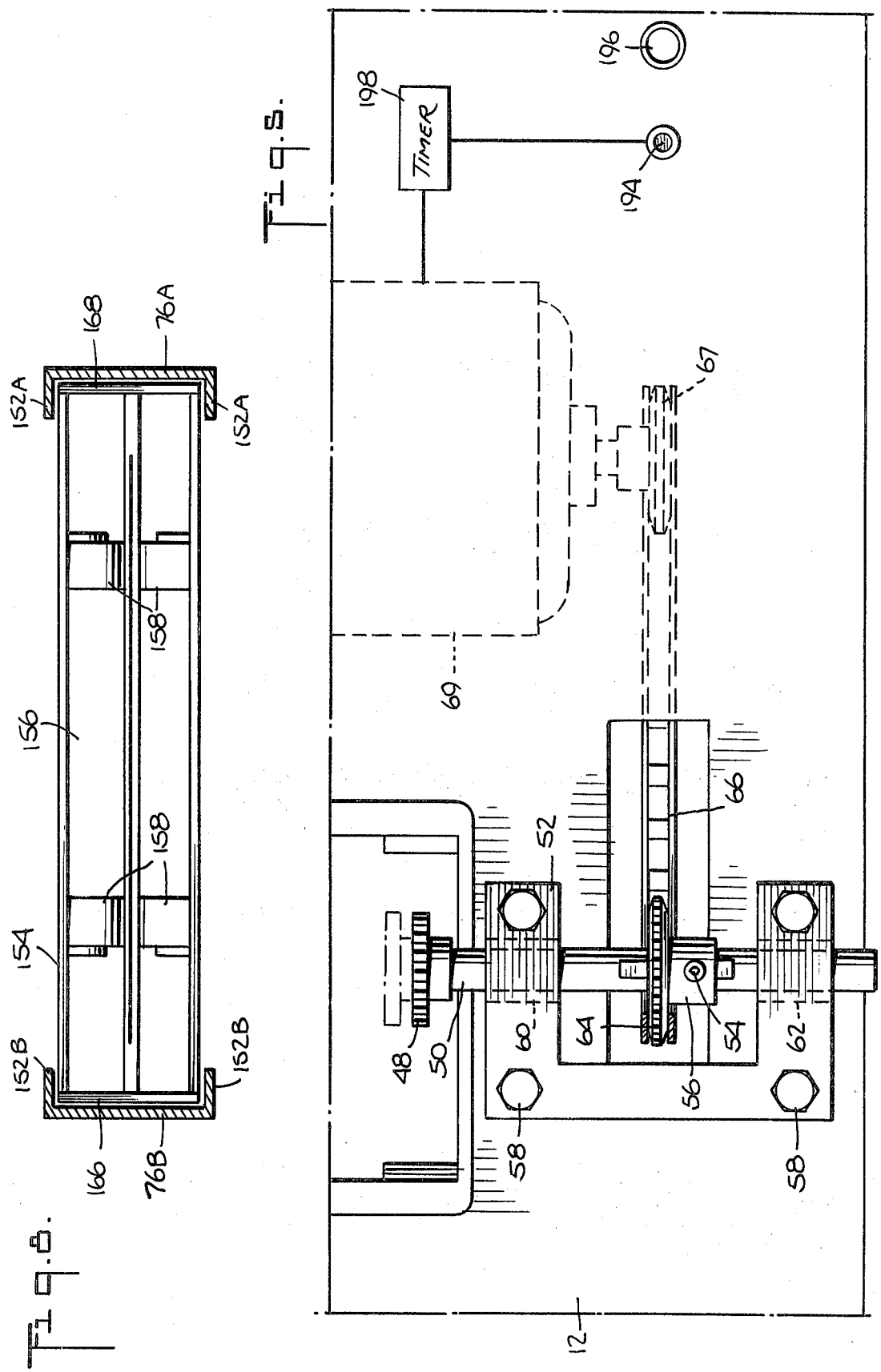

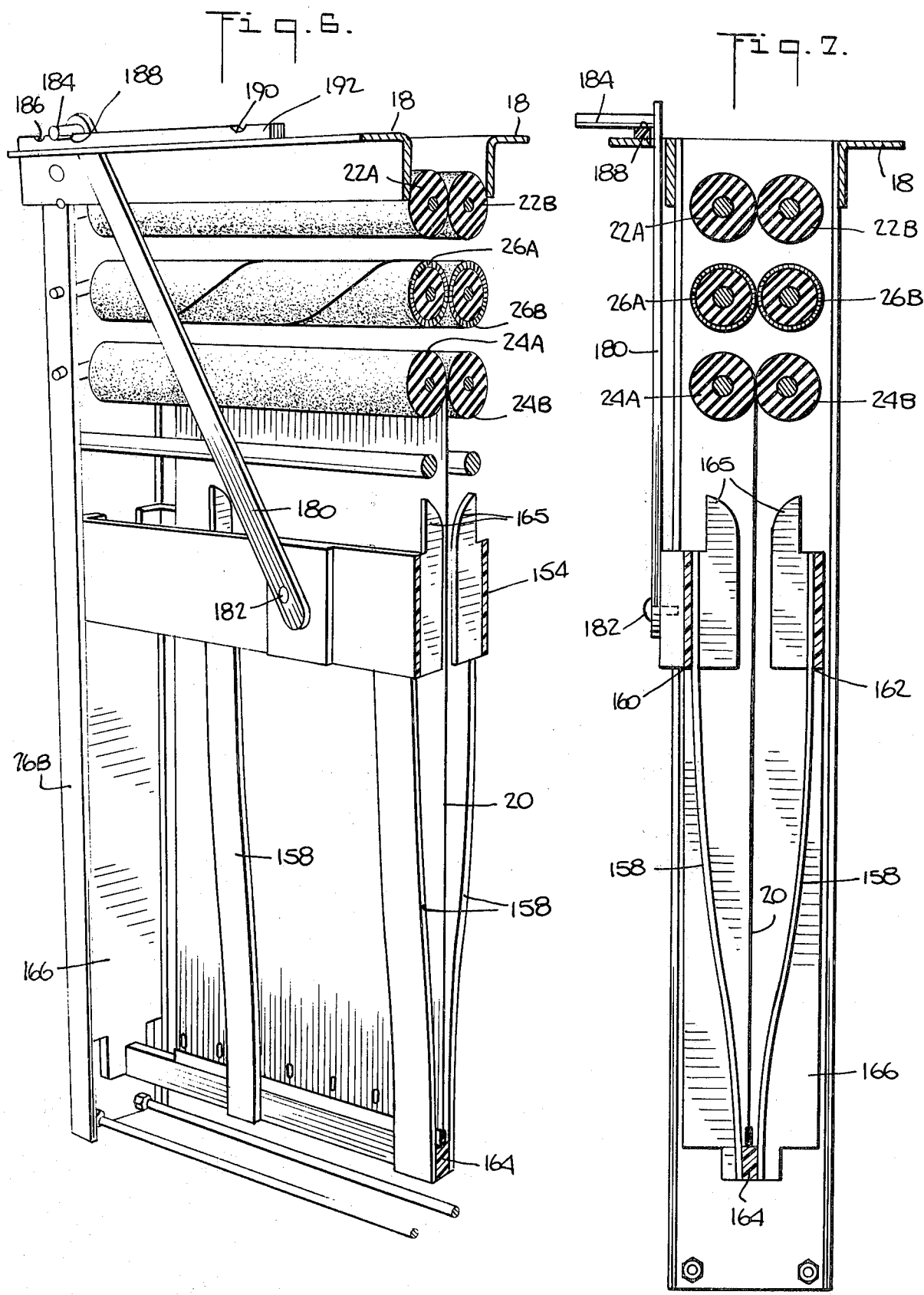

VERTICAL PLATE PROCESSOR

BACKGROUND OF THE INVENTION

The present invention relates to the preparation of printing plates and more particularly to the automatic processing of undeveloped sensitized printing plates.

There is presently known in the printing art apparatus for preparing planographic offset printing plates used in the lithographic printing process. Generally, automatic processors are known which receive the developer plates at one end and transport such plates in a horizontal direction through developer and scrubbing stations where a developer solution is applied over the exposed surfaces of the plates. The plate is discharged from the apparatus at an end located opposite to the entry end. One such apparatus is described in U.S. Pat. No. 3,762,808 issued, on May 16, 1973 to Robert C. Graham. While the horizontal type of plate processors have been widely used because they provide automatic processing in a uniform and time saving manner, there still exists a need for processors which do not require the table space associated with the horizontal processors, and which provide increased conservation of the developing solutions.

SUMMARY OF THE INVENTION

It is an object of the present invention to provide processing of offset printing plates in a manner which uses a minimum horizontal table top space. It is another object to provide a compact plate processor which provides automatic brushing, squeegee and dwelling time for plates which are transported in a vertical direction in the apparatus. It is a further object to provide an apparatus which allows the use of a one-step developing solution, which can be used many times over, always providing a plate ready for press use without further treatment. These, and other objects, are achieved by the present invention which provides a processor for developing offset printing plates in a tall, narrow tank mounted at one end of the processor work table with the table opening at the table top. The processor includes a pair of upper transport rollers and a pair of lower transport rollers for driving the plate out of the developer tank onto the work table. A pair of applicator roller brushes are mounted vertically between the upper and lower transport rollers for scrubbing the developer solution over the plate surfaces as the plate is passed between the applicator roller brushes. A spring-loaded cam leaver mechanism separates each pair of upper and lower transport rollers as well as the intermediate pair of roller brushes to permit insertion of a plate vertically from the top of the processor tank down between the rollers and into the developer solution. After a pre-set dwelling time, a drive motor is activated for rotating the transport rollers to deliver the plate up out of the processor tank. Also, an adjustable plate size adapter sets the height at which the plate can be lowered into the tank so that such plate never falls from between the nip of the lowest set of rollers in the processor tank. The processor provides automatic developing of the plate in a vertical, non-feedthrough operation, thereby permitting a compact, vertical and thin processor, and permitting conservation of the developer solution.

BRIEF DESCRIPTION OF THE DRAWINGS

FIG. 5 is a top view of the drive shaft and some associated gears and motor controls;

FIG. 6 is a perspective view of the adjustable plate size adapter used in the plate processor;

FIG. 7 is a side view of the adjustable plate size adapter shown in FIG. 6;

FIG. 8 is a cross-sectional view of the side frame members of the processor mechanism together with the sliding frame of the adjustable plate size adapter.

DESCRIPTION OF THE PREFERRED EMBODIMENT

Figure 1:
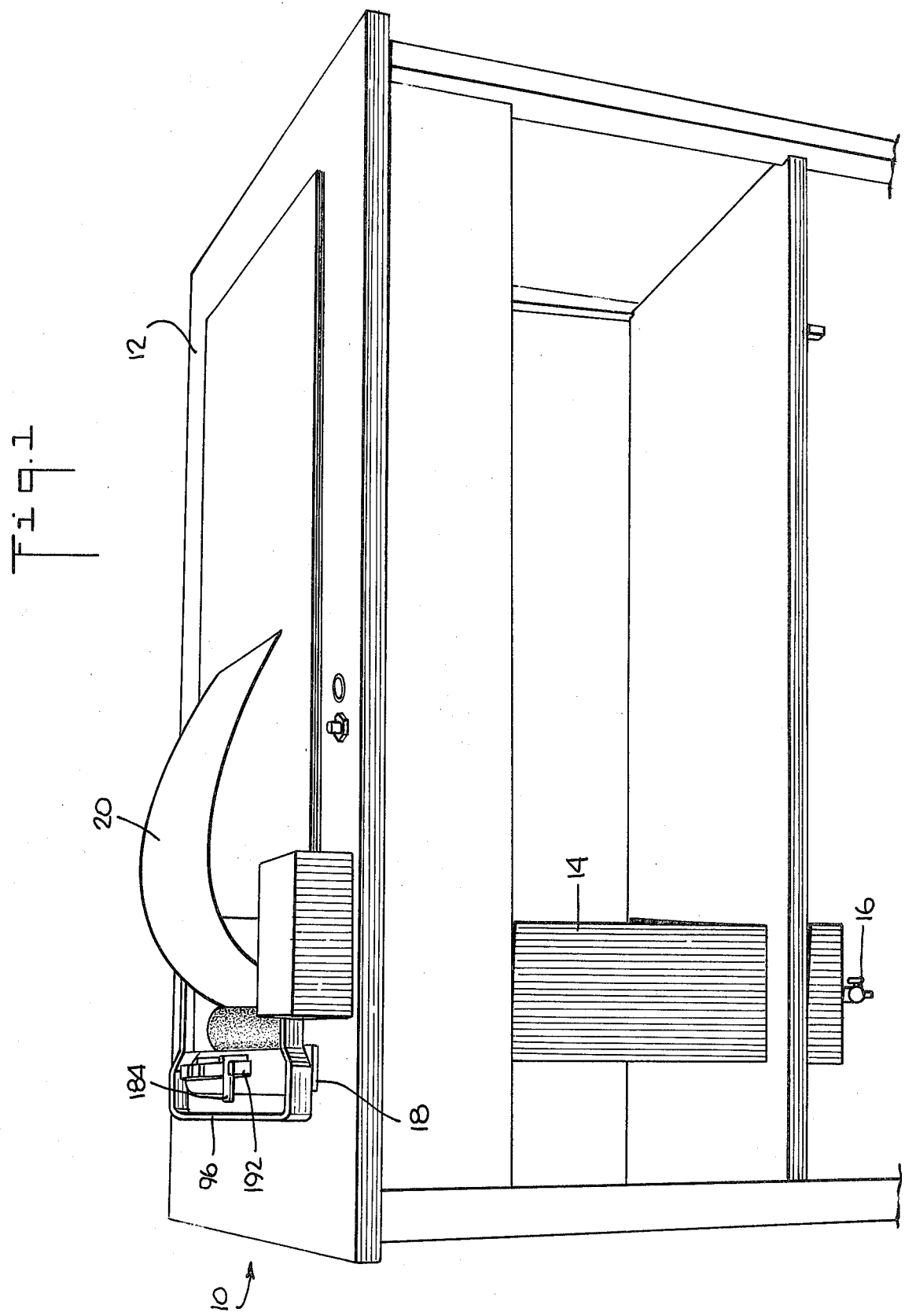
FIG. 1 is an overall perspective view of the duplicator plate processor of the present invention installed at one end of a work table.

Referring to FIG. 1, there is shown an overall perspective view of the duplicator plate processor 10 of the present invention. The processor 10 is vertically mounted under a work table 12 having an oblong, cut-out portion on the table top. A tank 14 containing the processor 10 is mounted with its open end facing up and located at the top of table 12. The bottom of tank 14 is provided with a drain spigot 16 for draining the developer solution from tank 14.

Figure 2:
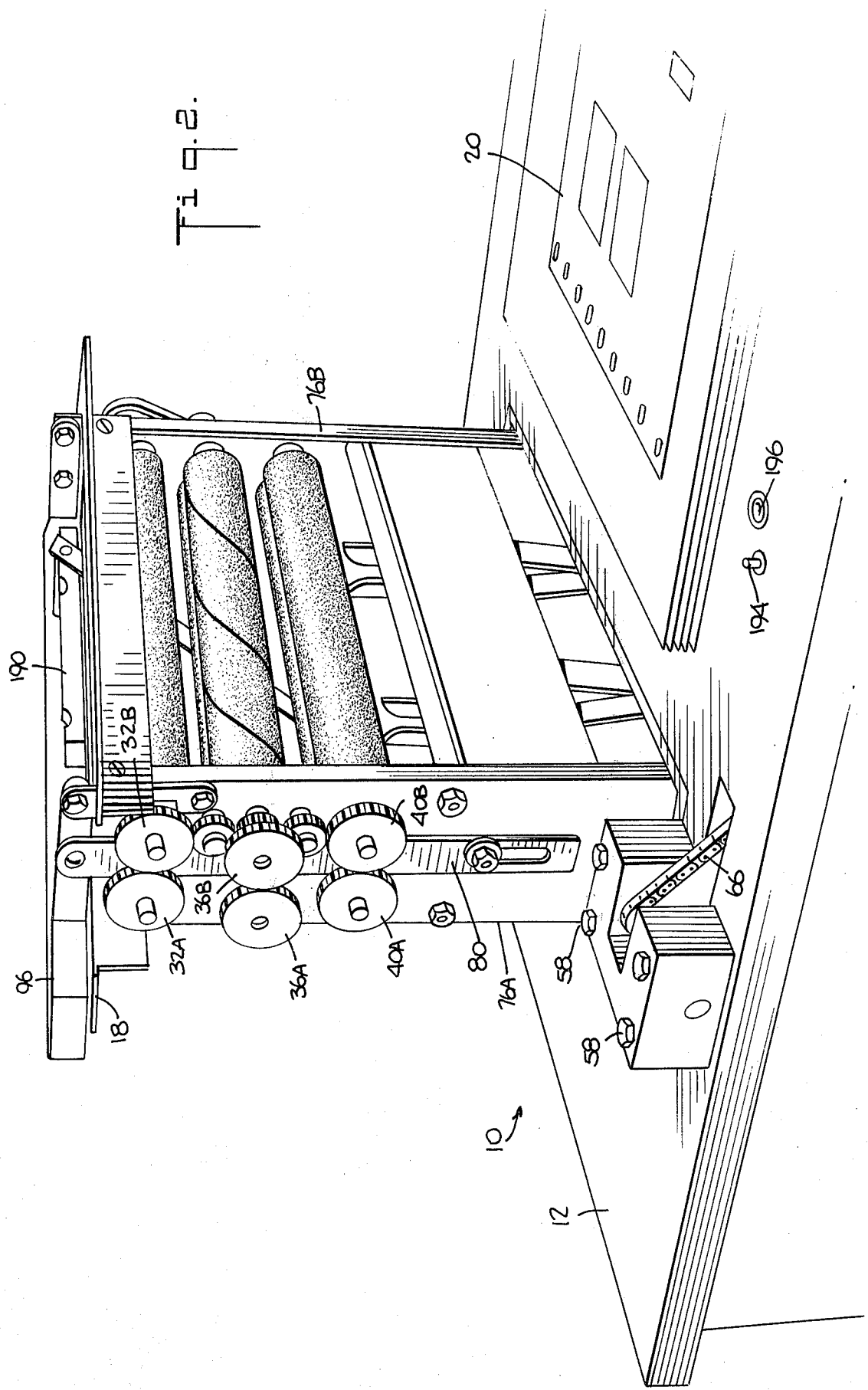
FIG. 2 is a perspective view of the processor mechanism shown only partly inserted in the processor tank.
Figure 3:
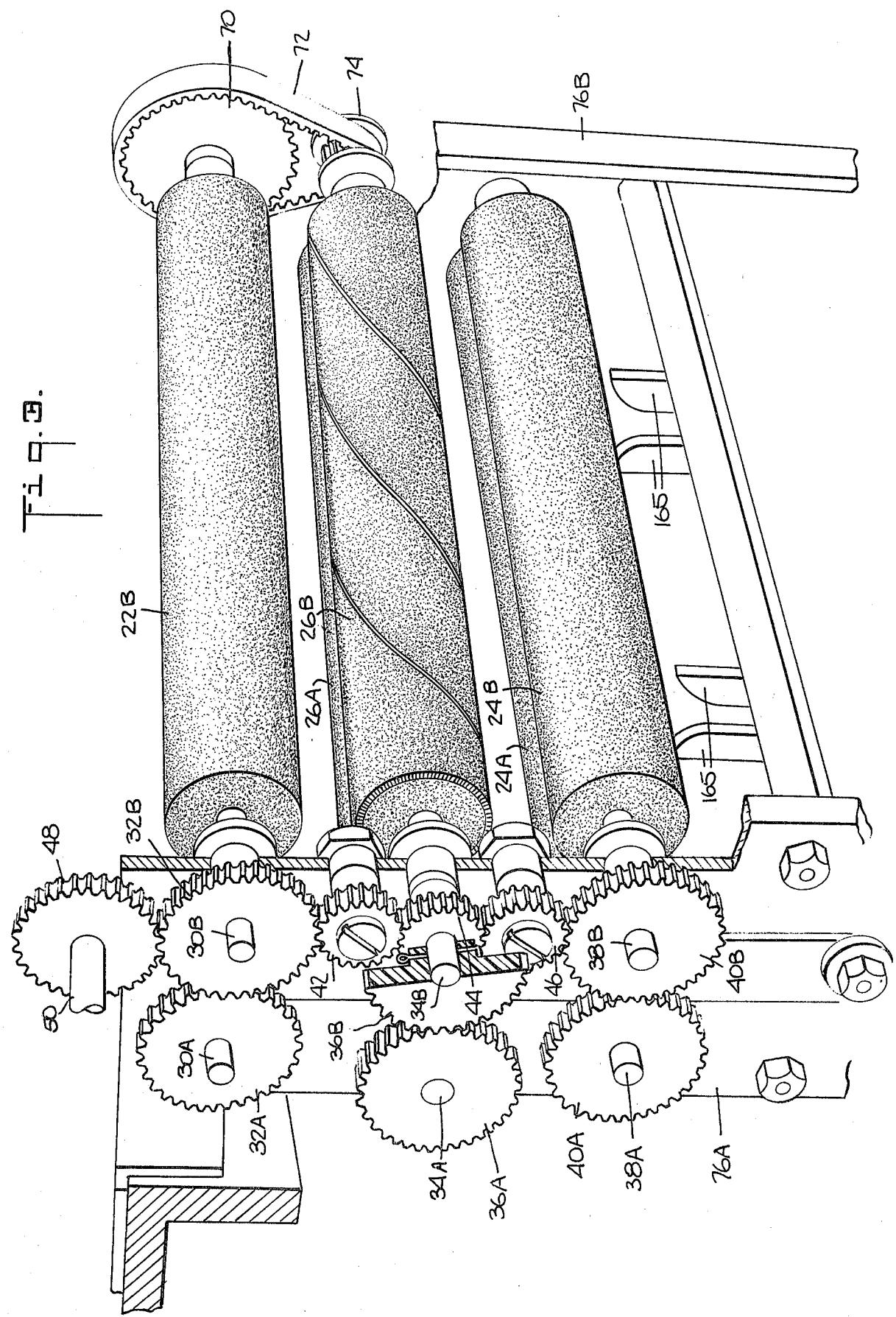
FIG. 3 shows a perspective view of the roller and gear drive mechanism of the processor.
Figure 4:
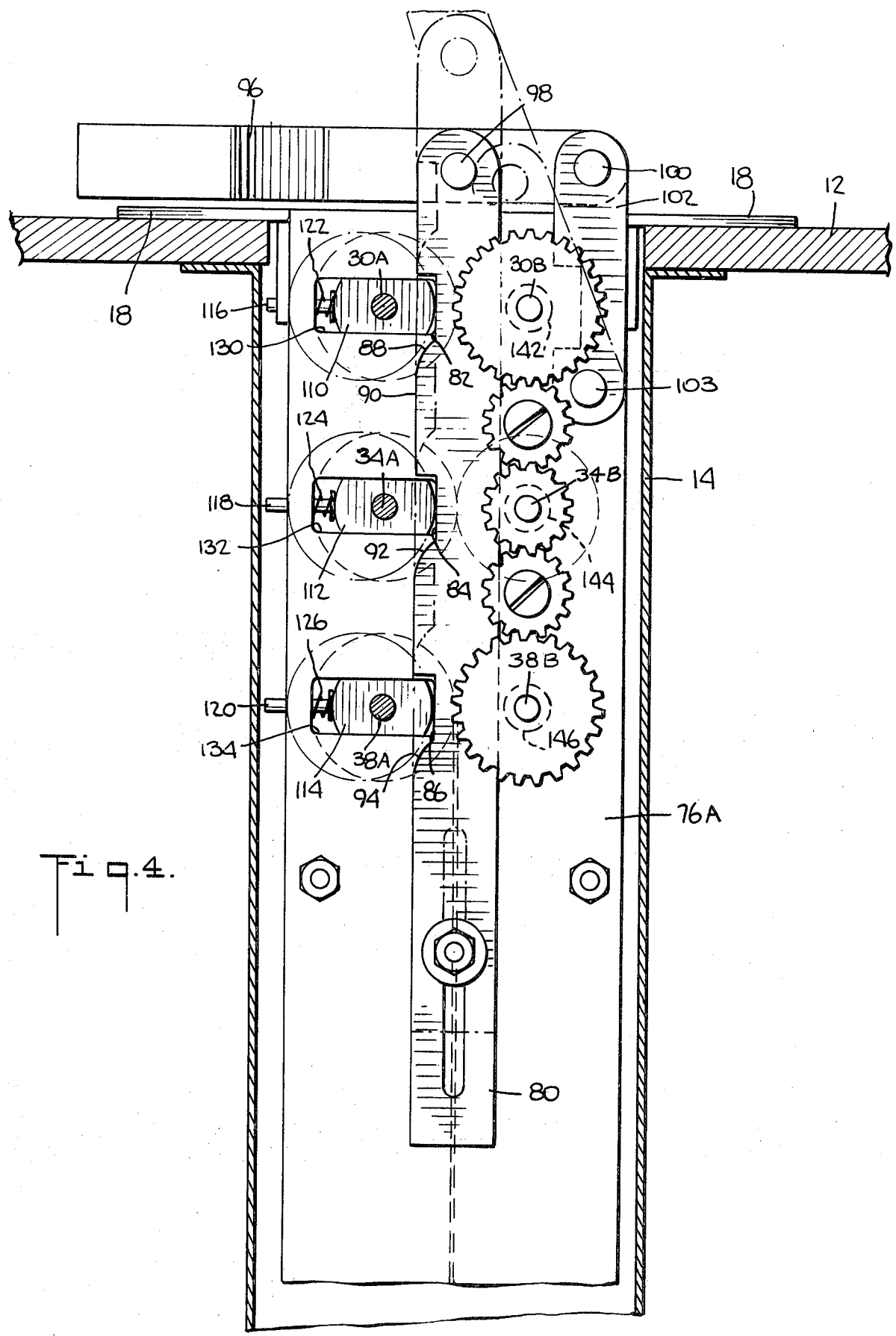
FIG. 4 shows an end view of the processor mechanism including the gears and the cam leaver mechanism for separating the rollers.

Referring to FIGS. 2, 3 & 4, there is shown various views of the processor mechanism which during its operation is fitted within the processor tank 14. Specifically, in FIG. 2, there is shown the processor mechanism when located only partially in the tank 14 to illustrate its relationship to the tank. The processor mechanism has connected at its top a pair of plates 18 which provide a shoulder which rests on the top surface of the table 12 when the processor mechanism is fully inserted into the tank 14, whereby the plates 18 support the processor mechanism from the top of the table 14. When the processor mechanism is in its operative position in the tank 14, as shown in FIG. 1, there is a rectangular opening through which a plate 20 can be inserted into the tank 14 for processing. As shown in more detail in FIG. 3, the plate processor mechanism includes a pair of upper transport rollers 22A and 22B, a pair of lower transport rollers 24A and 24B, and a pair of applicator brush rollers 26A and 26B. The upper pair of rollers 22A and 22B and the lower pair of rollers 24A and 24B comprise a conventional rubber material on their outside surfaces for the purpose of transporting the plate 20 between each pair of rollers, and for squeegee action as the plate exits. Roller 22A is mounted to operate in close contact with roller 22B along their surfaces so that they will drive the plate 20 as it passes between such rollers. Similarly, roller 24A is mounted adjacent the roller 24B to provide close contact therebetween. The middle pair of applicator brush rollers 26A and 26B comprise a bristle material, such as a pile polyolefin arranged on the rollers. The bristle material may be arranged in a spiral pattern on rollers 26A and 26B, such as is described in co-pending U.S. Pat. application Ser. No. 484,910, filed on July 1, 1974 by Delos E. Bown and entitled "Apparatus for Preparing Offset Printing Plates." As the transport rollers 22A and 22B and 24A and 24B drive the plate 20 out of the tank 14 containing the developer, the plate 20 passes between the applicator brush rollers 26A and 26B which are driven at a speed which is greater than the speed of the transport rollers 22A and 22B and 24A and 24B so that a brushing action occurs on the plate 20.

As shown in FIGS. 2 and 3, at one end of the processor mechanism, the transport rollers 22A and 22B are attached at their respective shafts 30A and 30B to meshing gears 32A and 32B, respectively, the brush rollers 26A and 26B are connected by their shafts 34A and 34B to meshing gears 36A and 36B, respectively, and transport rollers 24A and 24B are connected by their respective shafts 38A and 38B to meshing gears 40A and 40B, respectively. Each of the gears is comprised of a suitable material, such as nylon, which provides the appropriate strength and wear for the purpose employed. Additionally, three relatively smaller drive gears 42, 44 and 46 are provided which are relatively smaller than the above described gears attached on each roller shaft. As shown in FIGS. 3 and 4, the top right gear 32B associated with transport roller 22B is driven by a drive gear 48, further shown in FIG. 5. The drive gear 48 is mounted at the end of a drive shaft 50, as shown in FIG. 5, which shaft 50 is attached to be slid back and forth in a bearing block 52. The shaft 50 and gear 48 are moved longitudinally back and forth relative to block 52 to selectively disengage the gear 48 from the gear 32B of transport roller 22B and thereby allow the plate processor mechanism to be removed from the processor tank 14 or to be inserted into such tank. When the plate processor mechanism is in its operative position in the tank 14, the shaft 50 and drive gear 48 are extended into their operative position so that gear 48 meshes with the gear 32B. A set screw 54 is provided on a gear bushing 56 on shaft 50 so as to fixedly secure the shaft 50 to a chain drive gear 64. In this position, the gears 48 and 32B mesh in operating relationship.

Referring again to FIG. 5, the bearing block 52 is fixedly attached to the table of the processor 10 by bolts 58 and has bearing bushings 60 and 62 through which the shaft 50 extends. The gear 64 is attached to the shaft 50 and is driven by a chain 66 attached via a gear 67 to a motor 69. As the chain 66 drives the gear 64, the shaft 50 and its attached gear 48 are caused to rotate. With the shaft 50 in the operative position, the gear 48 meshes with the gear 32B thereby driving the same.

As shown in detail in FIG. 3, gear 32B meshes with gear 42 which meshes with gear 44, which in turn meshes with gear 46. Gear 46 is positioned to rotates the gear 40B. In this fashion, the rotation of the drive shaft 50 and the drive gear 48 causes the transport roller gears 32A and 32B and 40A and 40B to rotate. The gear 44 is rotatably mounted on the shaft 34B of the brush roller 26B. Gear 44 is mounted in a bearing around the shaft 34B so as to permit relative rotative movement while being fixed against longitudinal sliding on the shaft 34B. Therefore, when the gear 44 is caused to rotate by the gear 42, it does not cause the brush roller shaft 34B to rotate. Instead, gear 44 is used to transmit the rotative movement from the gear 42 over to the gear 46. In turn, gear 46 engages with gear 40B to cause rotation of the lower set of transfer rollers 24A and 24B. It is noted that the gears 42, 44 and 46 are generally of the same size, this being smaller than the relatively larger gears which they serve to drive.

Referring again to FIG. 3, there is also shown the drive mechanism for the brush rollers 26A and 26B, located at the opposite end of the roller gears described above. Specifically, a gear 70 is fixedly attached to the other end of the shaft 30B of transport roller 22B. Gear 70 in turn is operatively connected by a rubber timing belt 72 to a smaller gear or pulley 74. The gear 74 is fixedly attached to the shaft 34B and thereby causes rotation of the spiral brush roller 26B. As the transport roller 22B is caused to rotate by means of the drive gear 48, the gear 70 rotates and causes the smaller gear 74 to rotate. The gear 74 is designed relative to the gear 70 so that the brush roller 26B is caused to rotate several times faster than the transfer roller 22B. As an example, a suitable scrubbing action is provided when the gear ratio between gear 70 and gear 74 is 4:1 so that the brush rollers 26A and 26B will rotate 4 times faster than the transport rollers 22A and 22B, and 24A and 24B.

Figure 9:
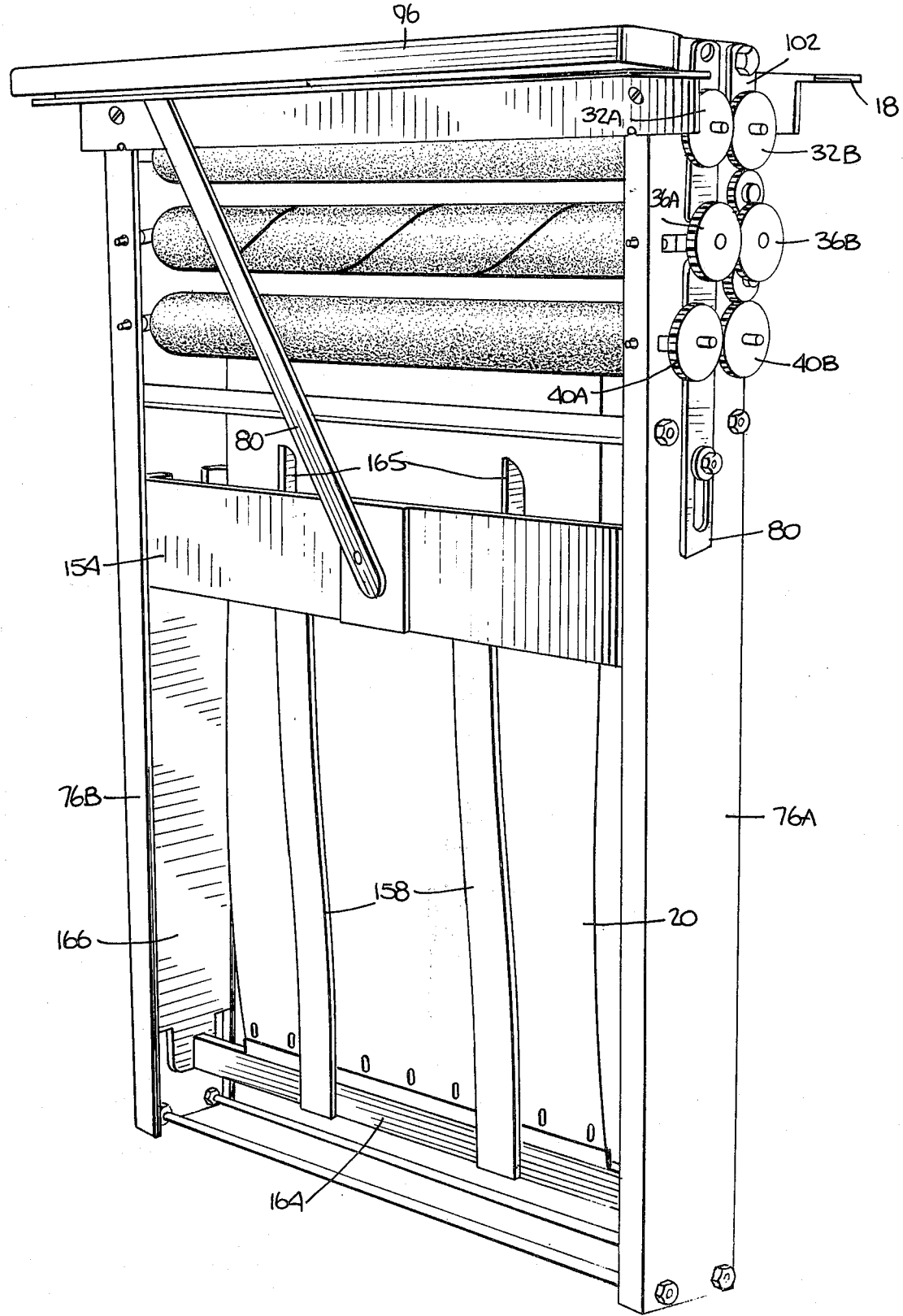
FIG. 9 is an overall perspective view of the processor mechanism.

Referring to FIG. 4, there is shown the means for separating the ones of each pair of rollers from their operative contacting positions to permit insertion of the plate therebetween. The developer mechanism is held together by a frame structure which includes a side frame plate 76A and 76B at the respective opposite ends. These side frame plates are shown and described in greater detail with reference to FIGS. 8 and 9. A spreader bar 80 is provided with three cut-out portions 82, 84 and 86, respectively, which are adjacent each of the roller shafts 30A, 34A and 38A, respectively, Cut-out portion 82 leads into a cam surface 88 which leads into the outer side portion 90 of the spreader bar 80. Similarly, the cut-out portions 84 and 86 lead into cam portions 92 and 94 which in turn lead out to the flat edge 90 of the spreader bar. A handle 96 is pivotally attached by pin 98 to the spreader bar 80. Handle 96 is also fixed at one end by a hinge pin 100 which also connects with a linkage arm 102. Linkage arm 102 is pivotally attached by a pin 103 to the side frame plate 76A. Each of the shafts 30A, 34A and 38A are provided at each end with bearings 110, 112 and 114, respectively, which are spring urged by spring-loaded, flat-headed pressure pins 116, 118 and 120, respectively, against the spreader bar portions 82, 84 and 86 respectively. Each of the pressure pins 116, 118, and 120 are urged by their respective coil springs 122, 124 and 126 against the bearings 110, 112 and 114. The bearing 110 is slidably mounted in an oblong slot 130 of the side frame plate 76A. Similarly, the bearings 112 and 114 are slidably mounted in oblong slots 132 and 134, respectively, in the side frame plate 76A. On the right side of the side frame plate 76A there are provided three circular holes for accommodating three shaft bearings 142, 144 and 146 in a fixed position. Bearings 142, 144 and 146 receive the shafts 30B, 34B and 38B respectively.

Generally, the side frame plate 76A shown in FIG. 3 is mounted at one end of the roller shafts while an essentially identical structure is mounted at the opposite end of such roller shafts. Each side frame plate is provided with three spaced apart holes on the left or right hand side for accommodating three circular shaft bearings 142, 144 and 146 in a fixed position in the side frame plate, and three oblong slots for accommodating three flat-sided shaft bearings 110, 112 and 114 which are adapted for movement therein. The three circular shaft openings and the three oblong slot openings are provided in each of the side frame plates, shown as 76A and 76B in FIG. 9, so that the three rollers 22A, 26A and 24A can be shifted from a contacting position with the respective rollers 22B, 26B and 24B into a loading position whereby the rollers are spaced apart by a predetermined amount. The rollers 22A, 26A and 24A are indicated by broken circular lines in FIG. 4. Thus, the three rollers on the one side of each mounting frame are set in a fixed bearing in the side frame plates 76A and 76B while the three adjacent rollers are mounted for slidable movement in such side frame plates.

In operation, in order to load the processor mechanism with a plate for development, the spreader bar handle 96 is raised into the load position thereby lifting the spreader bar 80 in its guide formed within the side frame plate 76A, so that the cam surfaces 88, 92 and 94 press the bearings 110, 112 and 114, respectively, and their associate shafts towards the left away from the adjacent rollers. The lifting of the spreader bar 80 causes the spring mounted bearings 110, 112, and 114 to be urged against the springs to the left through the action of the cam surfaces 88, 92 and 94 and the bar surface 90. This creates a space between the three sets of adjacent rollers so that the plate 20 may be inserted into the processor tank containing the developer solution. The plate 20 is inserted down between the adjacent pairs of rollers until such plate is completely immersed in the developer.

A depth positioner, shown in FIGS. 6, 7 and 8, is provided for adjusting the lowest position at which the plates may be immersed in the tank 14. The depth positioner is shown as comprising three settings for the depth positioning of various size plates in order that the shorter plates are not lowered below the bottom set of transport rollers 24A and 24B. The depth positioner thereby prevents the plate from dropping into the bottom of the tank 14 and out of the position where the rollers can automatically raise the plate out of the tank after processing. As described above, the plate processor mechanism includes the two side frame plates 76A and 76B which support each of the six rollers by means of the roller shaft bearings mounted on such plates.

Each of the side frame plates 76A and 76B have a shallow U-cross-section with respective shoulder or arm portions 152A and 152B, shown in FIG, 8, which extend out from the ends of the plates 76A and 76B. The U-channels provided by the two shoulder portions 152A and 152B accommodate a depth positioner frame 154 which rides in the track formed by the channels 152A and 152B. As shown by the cross-sectional view of FIG. 8, the depth positioner frame 154 provides a rectangular cross-section with an opening 156 through which a processing plate passes through as it is inserted into the tank 14. Frame 154 has attached thereto a plurality of plate retaining straps 158 which extend from the upper portion of frame 154 and taper generally downward near the bottom portion 164 of frame member 154. The strap 158 are attached to the upper portion of frame 154 at points 160 and 162 so that the straps, when observed from the positions near the side frames, taper downward in a general V-shape. Straps 158 may, for example, be comprised of semiflexible Lucite strips riding from the top portions of the frame 154 down to the centrally located bottom portion 164. The member 165 attached to frame 154 serve to guide a plate into the nip of the bottom rollers 24A and 24B.

The lower portion 164 of the frame 154 extends between the two side frame plates 76A and 76B and is fixedly attached to the frame 154 by side members 166 and 168. The lower portion 164 of frame 154 may comprise a single plastic bar extending from the lower portion of the side member 166 of the frame 154 to the other side member 168.

A depth bar 180 is attached at its lower end to the frame 154 by a bolt 182 which permits the bar 180 to pivot with respect to the frame 154. The upper end of the bar 180 has attached thereto a cylindrical rod 184 which is adapted to fit into any of the notches 186, 188 and 190 formed in a height adjustment rack 192 securely mounted on the upper plate 18 of the processor mechanism. The particular setting of the rod 184 in one of the notches 186, 188 or 190 will consequently vary the height at which depth positioner bar 180 holds the frame 154 in its channel formed in the side frame plates 76A and 76B. The particular depth at which the frame 154 is held will determine the lowest position of the bar 164 which provides the bottom limit for the processor plates. In this fashion, the processor plate 20 will not be lost from the nip between the bottom set of transport rollers 24A and 24B such that the relatively shorter plates can be accommodated by the processor by simply raising the height of the frame 154 and its bar 164. For example, the notch 186 will accommodate the shortest plates while the notch 190 will accommodate the longest plates since the plastic straps will be at their lowest point of travel. Of course, the number and position of the notches can be designed to the needs of the plate sizes expected for a particular system. If the operator should set the depth for a long plate and then insert a short plate, the plate would drop below the nip of the bottom rollers 24A and 24B. To recover the plate, the operator raises the frame 154 in the manner described above while the rollers are turning and the guide members 165 will guide the top edge of the plate into the nip of the rollers 24A and 24B.

The general operation of the processor mechanism is as follows. The handle 96 is raised to separate the rollers. The plate 20 is inserted into the tank 14 and between the separated rollers. The depth of the plate 20 in tank 14 is controlled by the setting of the rod 184 on adjustment rack 192. The handle 96 is then lowered to bring the rollers back into contact, with the lowest set of rollers 24A and 24B contacting the plate 20. The switch 194, shown in FIG. 5, is then pushed to activate the processor mechanism via a timer circuit 198. The red light 196 indicates that the machine is on. The timer 198 has an initial delay period, during which the plate may be allowed to dwell in the developing solution. Then the timer goes into its "On" period, activates the electric motor 69 which, through the drive mechanism, activates the transport rolls, and drives the plate out of the tank and on to the table. Usually, scrap paper is placed on the table and the plate is so placed in the processor that the direction of its curl is towards the table, and the transport mechanism drives the plate out onto the scrap paper on the table. It is to be noted that the top roller 22A is mounted slightly higher than roller 22B which further causes the plate to be delivered onto the table top. Then the operator of the machine may take a cheese cloth, and slightly buff the plate dry. The plate is then ready for use.

Although the above description is directed to the preferred embodiment of the invention, it is noted that other variations and modifications will be apparent to those skilled in the art, and therefore, may be made without departing from the spirit and scope of the present disclosure.

What is claimed is:

1. Apparatus for developing an offset printing plate, comprising:
   a tank containing a developing solution, said tank being open at the top to provide both inlet and outlet means for said plate;
   at least one pair of transport rollers for transporting said plate between said rollers and out of said developing solution, said transport rollers being mounted in the upper portion of said tank;
   means for separating said transport rollers from a first position whereby said rollers contact and drive said plate to a second position whereby one roller of each pair of said transport rollers is separated from the other roller of that same pair by a predetermined amount to permit said plate to be inserted down between said transport rollers and into said tank; and brush means for applying developing solution over the surfaces of said plate; and
   drive means for rotating said transport rollers for automatically delivering said plate up out of said tank.

2. Apparatus as recited in claim 1, wherein said brush means comprises at least one pair of rotatable applicator brushes adapted to receive said plate therebetween, said brushes being rotated to scrub the developing solution over the plate surfaces as the plate is transported between said applicator brushes.

3. Apparatus as recited in claim 2, further comprising means for separating said applicator brushes from a first position whereby said brushes provide a scrubbing action against the surfaces of said plate to a second position whereby said brushes are separated by a predetermined amount to permit said plate to be inserted down between said brushes and into said tank.

4. Apparatus as recited in claim 2, wherein said applicator brushes include tufted bristle material on their outside contacting surfaces.

5. Apparatus as recited in claim 2, wherein there is provided two pairs of transport rollers, with an upper pair of rollers being mounted vertically above said pair of applicator brushes and an lower pair of transport rollers being mounted vertically below said applicator brushes, whereby a plate can be passed between each of the two pairs of transport rollers and the pair of applicator brushes, whereby a plate can be passed between each of the two pairs of transport rollers and the pair of applicator brushes and into the developing solution.

6. Apparatus as recited in claim 1, wherein said means for separating said transport rollers comprise slidable bearings connected at the ends of the shafts of at least one of each pair of transport rollers, said slidable bearings being slidably mounted in respective oblong slots in the support structure for said apparatus, and means for shifting said slidable bearings within said oblong slots so that said transport rollers are moved between said first position and said second position.

7. Apparatus as recited in claim 6, wherein said means for shifting said slidable bearings include camming means providing a cam surface which cooperates with each of said slidable bearings.

8. Apparatus as recited in claim 7, wherein said camming means include a cam bar having a cam surface adapted for cooperation with each of said slidable bearings, and means for moving said cam bar to shift said slidable bearings between said first position and said second position.

9. Apparatus as recited in claim 7, further comprising spring means mounted against said slidable bearings for urging said slidable bearings against the cam surface of said camming means.

10. Apparatus as recited in claim 1, wherein said drive means for rotating said transport rollers includes motor means, first gear means for transferring the motor shaft rotation to a second gear means, and third gear means operatively connected to the shaft of at least one of said transport rollers said second gear means and said third gear means being operatively connected to each other, whereby the operation of said motor means causes said third gear means to rotate said transport rollers.

11. Apparatus as recited in claim 10, further comprising means for shifting said second gear means into or out of operative relationship with said third gear means such that said transport rollers and their associated gear means can be inserted or removed from said tank.

12. Apparatus as recited in claim 1, further comprising a depth positioner for adjusting the lowest position at which a plate can be immersed in said tank, said depth positioner including adjustment means for varying the lowest vertical position at which a plate can rest in said tank.

13. Apparatus as recited in claim 12, wherein said depth positioner includes a frame structure having side members and a bottom cross member for supporting said plate within said frame structure with said plate resting with its lowest edge on said bottom cross member, said frame structure being slidably mounted in said tank for vertical movement therein.

14. Apparatus as recited in claim 13, wherein said depth positioner includes height adjustment means connected to said frame structure and having two or more settings for maintaining said frame support structure at predetermined heights within said tank.

15. Apparatus as recited in claim 13, further comprising guide means at the top of said frame support structure for guiding said plate into the nip between a lowest pair of said transport rollers.

16. Apparatus as recited in claim 1, wherein a pair of transport rollers is mounted at the top of said tank with one of the two transport rollers at a vertical height above the other transport roller so that the plate is caused to be delivered out of the tank at a desired location.

17. Apparatus as recited in claim 1, further comprising switch means connected for activating said drive means, and time delay means electrically connected between said switch means and said drive means to provide a measured dwell time for said plate in said developing solution before said plate is driven up out of said tank.

18. Apparatus as recited in claim 17, further comprising indicator means connected to said switch means for indicating when the switch means is activated.

19. Apparatus as recited in claim 1, wherein said tank has a tall and thin configuration with an opening at the top.

20. Apparatus for developing an offset printing plate, comprising:
- a tank containing a developing solution, said tank being open at the top to provide both inlet and outlet means for said plate;
- an upper pair and a lower pair of transport rollers for transporting said plate between said rollers and out of said developing solution, said transport rollers being mounted in said tank;
- a pair of rotatable applicator brushes located intermediate said upper and lower pair of transport rollers and adapted to receive said plate therebetween, said brushes being rotated to scrub the developing solution over the plate surfaces as the plate is transported between said applicator brushes, said transport rollers and said applicator brushes being mounted with each pair substantially vertically above the other for guiding said plate in a vertical path in said tank;
- means for separating said transport rollers and said applicator brushes from a first position whereby said rollers and brushes contact said plate to a second position whereby one roller of each pair of said transport rollers and applicator brushes is separated from the other roller of that same pair by a predetermined amount to permit said plate to be inserted down between said transport rollers for automatically delivering said plate up out of said tank.

21. Apparatus for developing an offset printing plate, comprising:
- a tank containing a developing solution, said tank being open at the top to provide both inlet and outlet means for said plate;
- an upper pair of lower pair of transport rollers for transporting said plate between said rollers and out of said developing solution, said transport rollers being mounted in said tank;
- a pair of rotatable applicator brushes located intermediate said upper and lower pair of transport rollers and adapted to receive said plate therebetween, said brushes being rotated to scrub the developing solution over the plate surfaces as the plate is transported between said applicator brushes, said transport rollers and said applicator brushes being mounted with each pair substantially vertically above the other for guiding said plate in a vertical path in said tank;
- drive means for rotating said applicator brushes and for rotating said transport rollers for automatically transporting said plate in said tank; and
- switch means connected tor activating said drive means, and time delay means electrically connected between said switch means and said drive means to provide a measured dwell time for said plate in said developing solution before said plate is driven up out of said tank.

\* \* \* \* \*